United States Patent [19]

Esser et al.

[11] 4,234,807
[45] Nov. 18, 1980

[54] LADDER DEVICE WITH WEIGHTING FACTOR ADJUSTING MEANS

[75] Inventors: Leonard J. M. Esser; Ludovicus G. M. Heldens, both of Eindhoven, Netherlands

[73] Assignee: U.S. Philips Corporation, New York, N.Y.

[21] Appl. No.: 885,765

[22] Filed: Mar. 13, 1978

[30] Foreign Application Priority Data

Mar. 8, 1977 [NL] Netherlands .......................... 7702452

[51] Int. Cl.³ .............................................. H03L 1/00
[52] U.S. Cl. ................................. 307/304; 307/221 D; 307/264
[58] Field of Search ............... 307/221 C, 221 D, 304, 307/264; 328/167

[56] References Cited

U.S. PATENT DOCUMENTS

| 3,809,923 | 5/1974 | Esser ................................. 307/221 D |
| 3,877,056 | 4/1975 | Bailey ............................... 307/304 X |
| 4,034,199 | 7/1979 | Lampe et al. ..................... 328/167 X |

*Primary Examiner*—John Zazworsky
*Attorney, Agent, or Firm*—Thomas A. Briody; William J. Streeter; Bernard Franzblau

[57] ABSTRACT

A ladder device comprising at least three ladder sections connected in cascade and weighting-factor adjusting means coupled to said ladder sections and which comprises first and second field effect transistors (FET) having channel regions with different predetermined length/width ratios that define a weighting factor coefficient. A further fine adjustment of the weighting factor is achieved by adjusting the gate voltages of the FETs.

6 Claims, 6 Drawing Figures

LADDER DEVICE WITH WEIGHTING FACTOR ADJUSTING MEANS

The invention relates to a ladder device comprising at least three ladder sections connected in cascade, a coupling from a first signal input terminal to an input of one or more of said sections, a second coupling from an output of one or more of said sections to a signal output terminal, and weighting factor-adjusting means included in a said coupling and/or in a coupling between a given section and the succeeding section.

Ladder devices of this kind may for example be used to process signals in an analog manner, in which case the ladder sections may together form a ladder network. As an alternative they may be used to process signals in a digital manner, in which case the ladder sections may together form a shift register which shifts a signal, applied to its input in analog or digital form, stepwise from its input to its output under the influence of clock pulses. In the latter case the shift register may for example be constructed as a charge transfer device (CTD), a bucket brigade device (BBD) or a charge-coupled device (CCD).

U.S. Pat. No. 3,809,923 discloses a ladder device comprising a shift register having a plurality of sections in which signal transfer from each section to the next is controlled by clock voltages which are applied to the control electrodes of transistors included in the various sections. Couplings are also provided between the various sections and a signal output, these couplings each including weighting factor adjusting means which each comprise a pair of further field-effect transistors the gates of which are supplied with specific bias voltages. The weighting factor of the signal transmitted thereby to the output can be adjusted by adjusting the difference between the two gate voltages. It has been found that determination of the various weighting factors in this way can give rise to a non-linear signal transfer, which can be a disadvantage.

It is an object of the invention to mitigate this drawback.

According to one aspect the invention provides a ladder device comprising at least three ladder sections each having an input and an output and connected in cascade via said inputs and outputs, means for coupling a signal input terminal to at least one input of said ladder sections, a signal output terminal coupled to an output of at least one ladder section, and weighting-factor adjusting means coupled an input of a ladder section and/or in a coupling between a ladder section and the succeeding said section. The weighting-factor adjusting means comprises first and second field-effect transistor structures having a main electrode of each connected to an input of at least one ladder section, the channel regions thereof having mutually different predetermined length-to-width ratios defining a selected signal weighting coefficient. Both of said FET structures are integrated in the same semiconductor body. The ladder device also includes means for adjusting the gate voltages of the first and second FETs as a voltage difference so as to provide a further fine adjustment of the weighting factor.

According to another aspect the invention provides a ladder device comprising at least three ladder sections connected in cascade, a coupling from a signal input to an input of a ladder section, couplings from outputs of a plurality of said sections to a signal output, and weighting-factor adjusting means included in a coupling from an output of a ladder section and/or in the coupling between a ladder section and the succeeding said section, at least one said weighting factor adjusting means comprising first and second field-effect transistor structures the channel regions of which have mutually different length-to-width ratios and the channel of the first of which is included in series with the corresponding coupling, one main electrode of said first FET structure being effectively commoned with the corresponding main electrode of said second FET structure as seen from the coupling to or from said one main electrode, both of said FET structures being integrated in the same semiconductor body.

As a modification each ladder section may be replaced by a pair of ladder sections, the members of the ladder section group formed by one section from each pair being connected in cascade, as are the members of the ladder section group formed by the other section from each pair.

Embodiments of the invention will be described in detail, by way of example, with reference to the accompanying diagrammatic drawings, in which.

Figure 1:
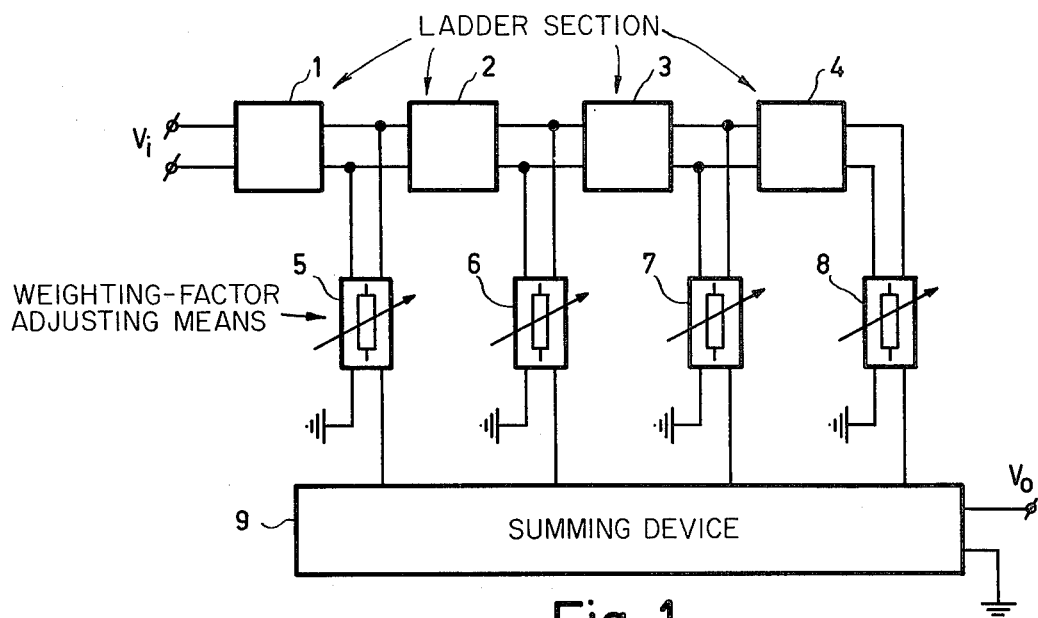
FIG. 1 shows the basic configuration of a first embodiment.

The ladder device shown in FIG. 1 comprises a plurality of ladder sections 1, 2, 3, 4. A signal $V_i$ applied to the first section 1 consecutively passes through the sections 1, 2, 3 and 4. The sections may, for example, include network elements as, for example, described in British Patent Specification 517,516, in which case a signal voltage which is applied to the input will consecutively pass through the sections of a ladder network thus formed. Each section delays the signal applied to its input by a certain amount thereby producing an effect on the pulse response characteristic of the device. The signals at the outputs of each of the sections 1, 2, 3, 4 are also fed to a common summing device 9 via individual weighting factor adjusting means 5, 6, 7 and 8 so that suitably chosen "weighted" signal portions are applied to the summing device 9 to produce a desired transfer characteristic from $V_i$ to an output $V_o$.

The device may, as an alternative, operate on the input signal in a digital manner, in which case the sections 1–4 may, for example, be constructed so that a signal in the form of an electric charge is shifted from one section to the next under the control of clock pulses, specific portions thereof being taken off and transferred to the summing device 9 by means of the weighting factor adjusting means. A device of this kind is known from the aforesaid U.S. Pat. No. 3,809,923 which describes an integrated circuit employing, as previously mentioned, pairs of field effect transistors as the various weighting factor adjusting means. The average of the gate voltages of the two transistors of each pair are the same and the difference between the gate voltages of the transistors of each pair determine the corresponding weighting factor.

The device of FIG. 1 also employs pairs of field effect transistors as weighting factor adjusting means. However, in contrast to the known device, the weighting factors provided by the adjusting means 5-8 of FIG. 1 are primarily determined by suitably choosing the relative ratios between the channel lengths L and the widths W of the two field-effect transistors included in each adjusting means. Fine adjustment of the weighting factors thus obtained may be achieved by superimposing a difference voltage on the otherwise equal gate electrode voltages of the relevant transistors.

Figure 2:
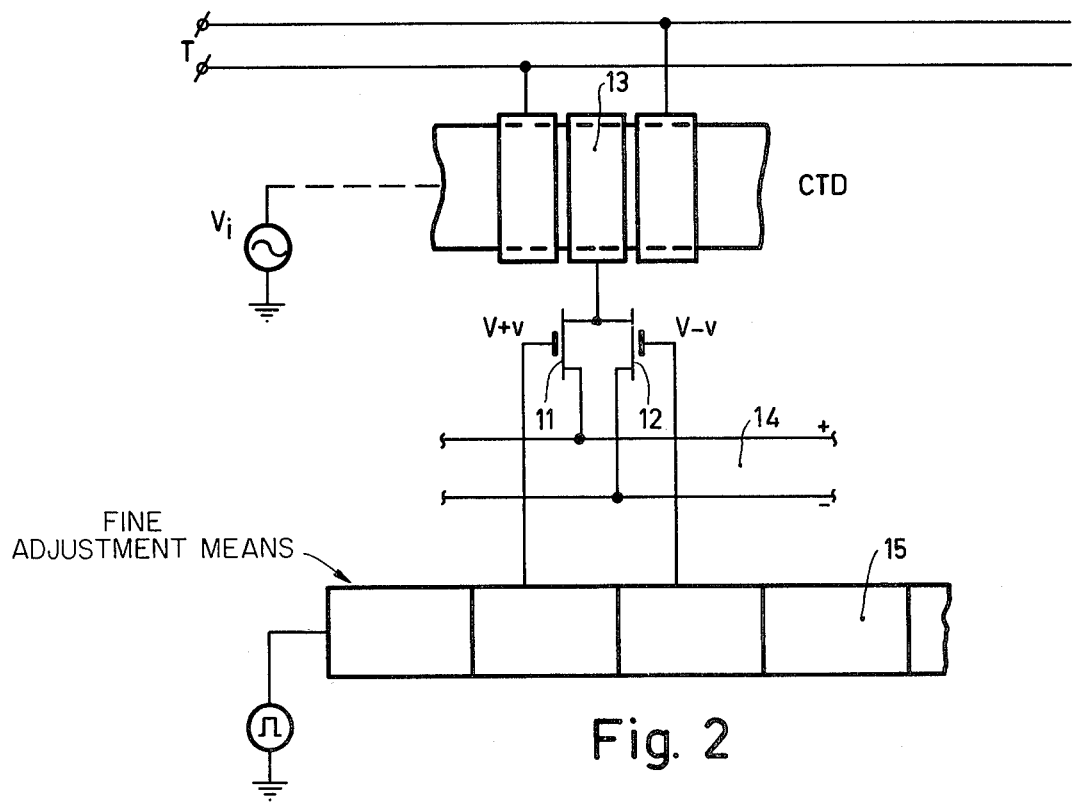
FIG. 2 shows one possible construction for a part of the embodiment of FIG. 1.

FIG. 2 shows, inter alia, a first possible construction for a single weighting factor adjusting means of FIG. 1. Similarly to the weighting factor adjusting means disclosed in the said U.S. Pat. No. 3,809,923, the adjusting means of FIG. 2 comprises two field effect transistors 11 and 12 which are connected both to a section 13 of a CTD (corresponding to the ladder device 1, 2, 3, 4 of FIG. 1) and to a balanced summing device 14 (corresponding to the device 9 of FIG. 1). Signals $V_i$ which are applied to the input of the CTD are shifted therethrough under the control of clock pulses T and therefore arrive at the section 13 after a given delay. The signals $V_i$ may be applied in the form of voltages, or, for example, in the form of light if the CTD is sensitive thereto. Field-effect transistors are used in the weighting factor adjusting means rather than bipolar transistors in order to avoid unnecessary current loading of the CTD. The transistors are both formed in an integrated circuit by one and the same process and have channel lengths $L_1$ and $L_2$ and channel widths $W_1$ and $W_2$ respectively. The transmission factor $\alpha$ between section 13 and the summing device 14 is given to a first approximation by $\alpha = a + bv$, where a and b are effectively constants and 2 v is the difference between the gate voltages of the transistors 11 and 12. The constants a and b depend on the settings of the transistors and are, to a first approximation, inversely proportional to $V - V_d$ (where V is the average gate voltage of the two transistors and $V_d$ is the input threshold voltage of each) and also directly proportional to $$\frac{W_1 L_2 - W_2 L_1}{W_1 L_2 + W_2 L_1}.$$

In the aforesaid U.S. Pat. No. 3,809,923 it is assumed that the two transistors have identical geometries. If this is so and the weighting factor adjustment is obtained by suitably choosing the difference between their two gate voltages, weighting factor adjustment gives rise to signal distortion because a larger or smaller portion of upper harmonics of the signal applied to the adjusting means 11, 12, relative to the fundamental thereof, is fed to the summing device 14 via the transistors 11, 12 depending on the difference 2 v between the gate voltages of the two transistors and on their average value.

In contradistinction to the known device, in the device of FIGS. 1 and 2 the gate voltages of the pair of field-effect transistors of each weighting factor adjusting means are substantially equal to each other and their value is, of course, preferably selected so as to minimize the adverse effect on the upper harmonics of the signal. The required weighting factors are primarily obtained by constructing the transistors included in each adjusting means, e.g. transistors 11 and 12 in FIG. 2, to have channels which have mutually different length/width ratios L/W. Only fine adjustments of the weighting factor given by each adjusting means is obtained (if required) by creating a difference 2 v between the gate voltages on the pair of transistors included in the corresponding adjusting means. These differences may be stored in a read-only memory (ROM), which may be integrated on the same semiconductor body as the CTD sections and the weighting factor adjusting means, the memory being programmed so that the desired fine adjustment of the weighting factors can be obtained with the required accuracy. The provisions required for this are denoted schematically by reference numeral 15 in FIG. 2.

If desired, the signal taken from the section 13 of the CTD may be applied to the transistors 11 and 12 via a source follower, rather than directly.

The summing device 14 in FIG. 2 may be connected to the inputs of a push-pull output amplifier which amplifies the signals which have been tapped off the ladder section 13 and which have been weighted by the weighting factor adjusting means 11, 12, these signals appearing as difference signals on the two conductors of the summing device 14.

Figure 3:
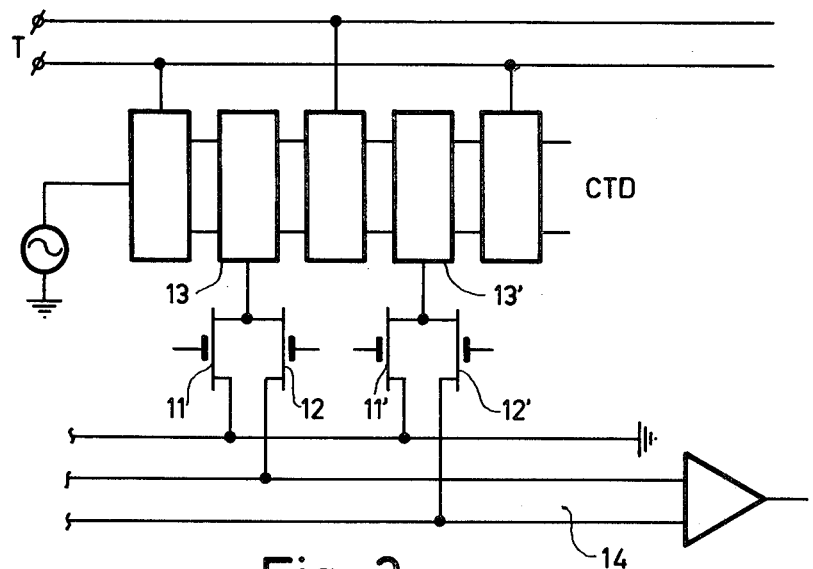
FIG. 3 shows an alternative possible construction for a part of the embodiment of FIG. 1.

As an alternative to the arrangement shown in FIG. 2, the output of one transistor of each adjusting means may be connected to a point of fixed potential, the outputs of the other transistors of the various weighting factor adjusting means each being connected to one of the two conductors of the summing device 14. Such an arrangement is shown in FIG. 3, this Figure also showing that, if desired, negative weighting factors may be obtained by connecting the outputs of the relevant adjusting means to an opposite-sign-input of the summing device 14 (see adjusting means 12, 12' in FIG. 3).

Instead of the section 13 and 13' each having a (floating electrode) output connected to the main electrodes of the transistors 11 and 12 and 11' and 12' respectively, they may have an input connected thereto, for example by arranging that the interconnected main electrodes of each transistor pair extend near the active region of the corresponding ladder section. If this is so, and a difference signal voltage is applied to the conductors of the device 14 from a source (not shown), it will be transferred to the various sections of the ladder device with the required weighting factors via the transistors 11 and 12, 11' and 12', and any other transistor pairs corresponding thereto. The result will be that a signal will be obtained at the end of the ladder device, this signal consisting of weighted, delayed signal portions, so that a desired transfer characteristic can be obtained in this way too. Thus the device may be operated in reverse if desired.

Figure 4:
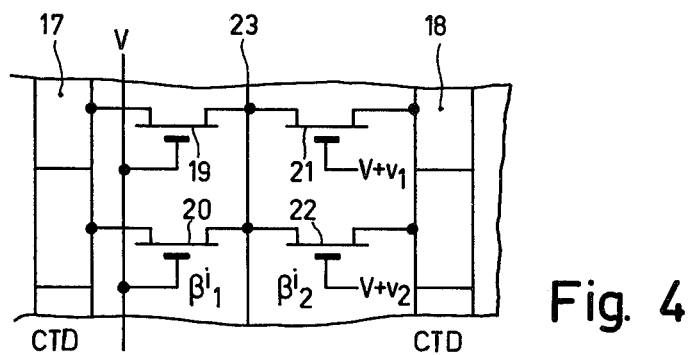
FIG. 4 is a diagram of a part of a second embodiment which is a modification of the first, and FIGS. 5 and 6 respectively show a cross-section and a plan view of the embodiment of FIG. 4.

FIG. 4 is a diagram of another ladder device comprising a charge transfer device system including two charge transfer devices 17 and 18 which are controlled by common clock pulses, individual sections of these devices being connected to a common line 23 via the channels of weighting factor adjusting transistors 19, 20 and 21, 22 respectively. The length/width ratios L/W of the channels of the two transistors which make up each weighting factor adjusting means (transistor pairs 19, 21 and 20, 22 respectively) again differ from each other substantially in conformity with the desired weighting factors. The relevant fine adjustments of the weighting factors are obtained by connecting the gate electrodes of the set of transistors which are connected to the device 17 to a fixed voltage V, and those of the set of transistors which are connected to the device 18 to voltages $V + v_1, V + v_2 \ldots$ respectively, where $v_1, v_2, \ldots$ are in accord with the various fine adjustments required. In a first mode of operation of the device of FIGS. 4-6 input signals may be applied to inputs (not shown) of the CTDs 17 and 18, and an output signal may be derived from the line 23. In a second mode of operation of the device of FIGS. 4-6 an input signal may be applied to the line 23 and output signals be derived from the outputs (not shown) of the CTDs 17 and 18. In the latter case the devices 17 and 18 may be read in push-pull. The embodiment of FIG. 4 may, if desired, include more than two CTDs which operate in parallel, each being provided with its own set of weighting factor adjusting transistors the output signals of all of which are combined by means of a summing device.

Figure 5:
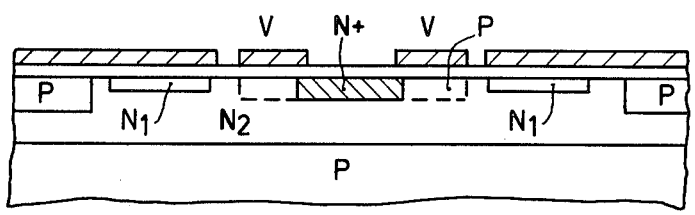
Figure 6:
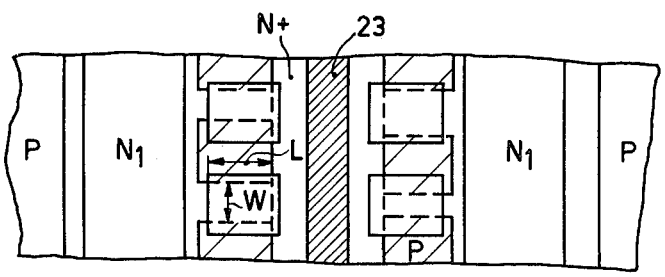

FIGS. 5 and 6 show how the device of FIG. 4 may be constructed in practice as an integrated circuit, FIG. 5 being a section through such a circuit and FIG. 6 being a plan view thereof drawn in such a way as to show various features which will be hidden in practice. The circuit comprises a p-type substrate on which is provided an n-type layer $N_2$. The surface of layer $N_2$ is provided with an insulating covering on which various electrodes are provided. Various p-type zones are formed in the n-type layer $N_2$ as shown, as are n-type zones N+ and $N_1$ of a different impurity concentration. The central N+ zone is connected to the conductor 23 through an elongate window in the oxide layer and forms the common source of the various weighting factor adjusting means transistors. Corresponding transistors of the various weighting factor adjusting means are isolated from each other by the p-type zones on each side of the central N+ zone, these p-type zones defining the channels of the various transistors and a gate electrode being provided on the insulating layer overlying each channel thus defined. The outer zones $N_1$ and P form part of the (bulk channel) CTDs 17 and 18, as do the electrodes overlying them. In operation voltages (relative to the substrate) are applied to the various electrodes with polarities and magnitudes such that a drain region is induced for each transistor in the region of the adjacent CTD and such that the channel of each transistor is pinched off to a substantial extent by a depletion region extending thereto from the substrate.

As an alternative to or in addition to the weighting factor adjusting means of the embodiments described, weighting factor adjusting means may be provided in the device between the ladder sections so that a specific weighted portion of the output of each section is transferred to the input of the next section. This may be done by connecting the common sources of the two transistors of each weighting factor adjusting means to the output of one ladder section, the drain of one transistor of the pair to the input of the next section, and the drain of the other transistor of the pair to a point of constant potential, e.g. ground. If this is done the input signal may be applied to various sections in parallel, the output being taken from the final section of the ladder, or the input signal may be applied to the first section of the ladder, the output then being taken from various sections via an adder.

What is claimed is:

1. A ladder device comprising at least three ladder sections each having an input and an output, first means for coupling said ladder sections in cascade via said inputs and outputs, second means for coupling a signal input terminal to at least one input of said ladder sections, a signal output terminal coupled to an output of at least one ladder section, weighting-factor adjusting means coupled to an input of at least one ladder section, said weighting-factor adjusting means comprising first and second field-effect transistors each having a main electrode connected to said input of said one ladder section, the channel regions of said first and second transistors having mutually different predetermined length-to-width ratios defining a selected weighting factor coefficient, both of said transistors being integrated in the same semiconductor body, and means for adjusting the gate voltages of said first and second field-effect transistors as a voltage difference so as to provide a further fine adjustment of the weighting factor.

2. A ladder device as claimed in claim 1 wherein said gate voltage adjusting means includes means for applying substantially equal potentials to the gate electrodes of said first and second field-effect transistors.

3. A ladder device comprising at least three ladder sections connected in cascade with each ladder section having an input and an output, a coupling from a signal input terminal to an input of a ladder section, means coupling the outputs of a plurality of said ladder sections to a signal output terminal, said coupling means including weighting-factor adjusting means comprising first and second field-effect transistors each having a main electrode connected in common to an output of one of said ladder sections, the channel regions of said first and second transistors having mutually different length-to-width ratios defining a desired weighting factor coefficient, both of said transistors being integrated in the same semiconductor body, and means for adjusting the gate voltages of said first and second field-effect transistors to provide a fine adjustment of the weighting factor.

4. A device as claimed in claim 3, further comprising means for applying substantially equal potentials to the gate electrodes of said first and second field-effect transistors.

5. A ladder device as claimed in claim 3 further comprising second means for coupling said three ladder sections in cascade, said second coupling means including weighting-factor adjusting means comprising at least one pair of third and fourth field-effect transistors having channel regions of mutually different length-to-width ratios defining a desired weighting factor coefficient, both of said third and fourth transistors being integrated in the same semiconductor body, and means for adjusting the gate voltages of said third and fourth transistors to provide a fine adjustment of the weighting factor.

6. A ladder device as claimed in claim 3 wherein said coupling means further comprises a summing device coupled to receive signals appearing at an output of the weighting-factor adjusting means and having an output coupled to said signal output terminal.

* * * * *